United States Patent
Simpson

(10) Patent No.: US 11,603,329 B2
(45) Date of Patent: Mar. 14, 2023

(54) METHODS FOR PREPARING A SUPEROMNIPHOBIC COATING

(71) Applicant: Waymo LLC, Mountain View, CA (US)

(72) Inventor: John T. Simpson, Sahuarita, AZ (US)

(73) Assignee: Waymo LLC, Mountain View, CA (US)

( * ) Notice: Subject to any disclaimer, the term of this patent is extended or adjusted under 35 U.S.C. 154(b) by 97 days.

(21) Appl. No.: 16/855,378

(22) Filed: Apr. 22, 2020

(65) Prior Publication Data
US 2021/0331967 A1    Oct. 28, 2021

(51) Int. Cl.
*C23C 14/00* (2006.01)
*C03C 17/02* (2006.01)
(Continued)

(52) U.S. Cl.
CPC .............. *C03C 17/02* (2013.01); *C03C 15/00* (2013.01); *C03C 17/3441* (2013.01);
(Continued)

(58) Field of Classification Search
CPC ..................................................... C23C 14/00
See application file for complete search history.

(56) References Cited

U.S. PATENT DOCUMENTS 3,856,404 A * 12/1974 Hershler ................. G01N 21/49
356/36
4,042,359 A   8/1977 Schnabel et al.
(Continued)

FOREIGN PATENT DOCUMENTS

CN    103922351      7/2014
CN    105499092 A    4/2016
(Continued)

OTHER PUBLICATIONS

"Synthesis and Formation of Silica Aerogel Particles by a Novel Sol-Gel Route in Supercritical Carbon Dioxide", Ruohong Sui, Amin S. Rizkalla, and Paul A. Charpentier, J. Phys. Chem. B, 108, 11886-11892. (Year: 2004).*
(Continued)

*Primary Examiner* — David P Turocy
*Assistant Examiner* — Mohammad Mayy
(74) *Attorney, Agent, or Firm* — McDonnell Boehnen Hulbert & Berghoff LLP

(57) ABSTRACT

A method for preparing an optically transparent, superomniphobic coating on a substrate, such as an optical substrate, is disclosed. The method includes providing a glass layer disposed on a substrate, the glass layer having a first side adjacent the substrate and an opposed second side, the glass layer comprising 45-85 wt. % silicon oxide in a first glass phase and 10-40 wt. % boron oxide in a second glass phase, such that a glass layer has a composition in a spinodal decomposition region. The method further includes heating the second side of the glass layer to form a phase-separated portion of the layer, the phase-separated portion comprising an interpenetrating network of silicon oxide domains and boron oxide domains, and removing at least a portion of the boron oxide domains from the phase-separated portion to provide a graded layer disposed on the substrate. The graded layer has a first side disposed adjacent the substrate, the first side comprising 45-85 wt. % silicon oxide and 10-40 wt. % boron oxide, and opposite the first side, a porous second side comprising at least 45 wt. % silicon oxide and no more than 5 wt. % boron oxide.

19 Claims, 2 Drawing Sheets

(51) Int. Cl.
| | |
|---|---|
| *C23C 14/10* | (2006.01) |
| *C23C 14/06* | (2006.01) |
| *C23C 14/02* | (2006.01) |
| *C03C 15/00* | (2006.01) |
| *C03C 17/34* | (2006.01) |
| *C03C 17/42* | (2006.01) |
| *C23C 14/34* | (2006.01) |

(52) U.S. Cl.
CPC ............ *C03C 17/42* (2013.01); *C23C 14/021* (2013.01); *C23C 14/024* (2013.01); *C23C 14/0605* (2013.01); *C23C 14/10* (2013.01); *C23C 14/34* (2013.01); *C03C 2217/425* (2013.01); *C03C 2217/76* (2013.01); *C03C 2218/11* (2013.01); *C03C 2218/113* (2013.01); *C03C 2218/154* (2013.01); *C03C 2218/33* (2013.01)

(56) References Cited

U.S. PATENT DOCUMENTS

| | | | |
|---|---|---|---|
| 5,514,440 A * | 5/1996 | Gotoh | G11B 7/24 346/135.1 |
| 6,200,914 B1 * | 3/2001 | Schulten | H01B 1/04 442/111 |
| 6,770,584 B2 | 8/2004 | Barney et al. | |
| 7,211,605 B2 | 5/2007 | Coronado et al. | |
| 7,258,731 B2 | 8/2007 | D'Urso et al. | |
| 7,348,389 B2 | 3/2008 | Graham et al. | |
| 8,298,622 B2 | 10/2012 | Nakayama et al. | |
| 8,509,669 B2 | 8/2013 | Moorlag et al. | |
| 8,580,027 B1 | 11/2013 | Campos et al. | |
| 8,658,243 B2 | 2/2014 | Yamada et al. | |
| 8,679,578 B2 | 3/2014 | Akutagawa et al. | |
| 8,741,158 B2 | 6/2014 | Aytug et al. | |
| 8,741,432 B1 | 6/2014 | Campos et al. | |
| 9,221,076 B2 | 12/2015 | Simpson et al. | |
| 9,308,501 B2 | 4/2016 | Hu et al. | |
| 9,334,404 B2 | 5/2016 | Simpson et al. | |
| 9,752,049 B2 | 9/2017 | Armstrong et al. | |
| 9,771,656 B2 | 9/2017 | Aytug et al. | |
| 9,777,161 B1 | 10/2017 | Campos et al. | |
| 10,155,688 B2 | 12/2018 | Simpson | |
| 10,787,586 B2 | 9/2020 | Simpson | |
| 10,870,775 B2 | 12/2020 | Simpson | |
| 11,434,389 B2 | 9/2022 | Simpson | |
| 11,447,654 B2 | 9/2022 | Simpson | |
| 2004/0033882 A1 * | 2/2004 | Barney | C04B 30/02 501/95.1 |
| 2008/0311390 A1 * | 12/2008 | Seal | C03C 17/02 427/331 |
| 2009/0042469 A1 | 2/2009 | Simpson | |
| 2011/0256375 A1 | 10/2011 | Yoshida et al. | |
| 2012/0088066 A1 * | 4/2012 | Aytug | C03C 17/34 428/141 |
| 2012/0107581 A1 * | 5/2012 | Simpson | C09D 175/04 427/256 |
| 2013/0157008 A1 | 6/2013 | Aytug et al. | |
| 2013/0186139 A1 | 7/2013 | Tanii | |
| 2013/0236695 A1 | 9/2013 | Aytug et al. | |
| 2014/0120340 A1 | 5/2014 | Riddle et al. | |
| 2014/0130710 A1 | 5/2014 | Laukkanen et al. | |
| 2014/0287243 A1 | 9/2014 | Weber et al. | |
| 2014/0320728 A1 * | 10/2014 | Sugiyama | C03C 11/005 348/340 |
| 2015/0239773 A1 | 8/2015 | Aytug | |
| 2015/0240123 A1 | 8/2015 | Kissel et al. | |
| 2016/0130449 A1 | 5/2016 | Kissel et al. | |
| 2017/0036241 A1 | 2/2017 | Constantinou et al. | |
| 2017/0204279 A1 | 7/2017 | Larimer et al. | |
| 2017/0283316 A1 | 10/2017 | Meuler et al. | |
| 2017/0362257 A1 | 12/2017 | Venema | |
| 2018/0171469 A1 | 6/2018 | Aytug | |
| 2019/0264058 A1 | 8/2019 | Simpson | |

FOREIGN PATENT DOCUMENTS

| | | |
|---|---|---|
| CN | 107254237 | 10/2017 |
| CN | 107267030 A | 10/2017 |
| CN | 107384055 A | 11/2017 |
| JP | H10-158038 A | 6/1998 |
| JP | 2006151800 | 6/2006 |
| JP | 5024886 | 9/2012 |
| JP | 2013180221 A | 9/2013 |
| JP | 2014199753 A * | 10/2014 |
| JP | 2015123592 A * | 7/2015 |
| WO | 2010033288 A2 | 3/2010 |
| WO | 2011/001036 | 1/2011 |
| WO | 2012/115986 | 8/2012 |
| WO | 2012/121677 | 9/2012 |
| WO | 2014/035742 | 3/2014 |

OTHER PUBLICATIONS

JP2014199753A English translate (Year: 2014).*
JP-2015123592-A, English Translated (Year: 2015).*
International Search Report and Written Opinion, dated Jul. 28, 2021, in International Patent Application No. PCT/US2021/026601.
Aytug et al., "Optically Transparent, Mechanically Durable, Nanostructured Superhydrophobic Surfaces Enabled by Spinodally Phase-Separated Glass Thin Films," Nanotechnology 24(31):315602 (Jul. 15, 2013).
Aytug, "Atomically Bonded Transparent Superhydrophobic Coatings," Oak Ridge National Lab (ORNL) No. ORNL/TM-2015/197 (Aug. 1, 2015).
Junyan et al., "Durable superhydrophobic/highly oleophobic coatings from multi-dome SiO2 nanoparticles and fluoroacrylate block copolymers on flat substrates," Journal of Materials Chemistry A 3:20134-44 (Jul. 27, 2015).
Simpson et al., "Superhydrophobic materials and coatings: a review," Reports on Progress in Physics 78(8):086501 (Jul. 16, 2015).
Yang et al., "Facile preparation of super-hydrophobic and super-oleophilic silica film on stainless steel mesh via sol-gel process," Applied Surface Science 256(13):4095-102 (Apr. 15, 2010).

* cited by examiner

METHODS FOR PREPARING A SUPEROMNIPHOBIC COATING

BACKGROUND

Unless otherwise indicated herein, the materials described in this section are not prior art to the claims in this application and are not admitted to be prior art by inclusion in this section.

Superhydrophobic coatings having exceptional water repellency properties have potential application in numerous fields of endeavor. However, such surfaces and coatings can be poorly repellant to oily material (i.e., low oleophobicity), such as road grime (e.g., in automotive applications). Though superomniphobic materials having exceptional water and oil repellency properties have been achieved, conventional superomniphobic materials have micron-scale roughness, and accordingly can be difficult to keep clean (e.g., from "bug splats"). Moreover, such materials are often susceptible to shear force, which can remove some of the surface texturing (e.g., nano-texturing and/or micro-texturing).

Additionally, conventional superomniphobic materials are of limited use as coatings in optical applications. The micron-scale roughness noted above tends to scatter light and makes optical clarity difficult to achieve. Typically, thin films of such materials are only transparent to a narrow range of wavelengths (e.g., visible-range light, or even a portion thereof). And because materials with high optical clarity tend to have low surface roughness, typical optical substrates have a very smooth surface that can limit strong bonding to a superomniphobic coating.

Accordingly, there remains a need for optically transparent, superomniphobic coatings that can be strongly bonded to a substrate, such as an optical substrate.

SUMMARY

In one aspect, the present disclosure provides a method for preparing a coating. The method comprises providing a glass layer disposed on a substrate, the glass layer having a first side adjacent the substrate and an opposed second side, the glass layer comprising 45-85 wt. % silicon oxide in a first glass phase and 10-40 wt. % boron oxide in a second glass phase, such that glass layer has a composition in a spinodal decomposition region. In this region, heating the glass layer to temperatures approaching its melting point results in the two glass phases undergoing spinodal decomposition in which phase separation occurs without nucleation and the two phases stay interconnected.

The method further comprises heating the second side of the glass layer to form a phase-separated portion of the layer, the phase-separated portion comprising an interpenetrating network of silicon oxide domains and boron oxide domains and removing at least a portion of the boron oxide domains from the phase-separated portion to provide a graded layer disposed on the substrate. The graded layer has a first side disposed adjacent the substrate, the first side comprising 45-85 wt. % silicon oxide and 10-40 wt. % boron oxide, and opposite the first side, a porous second side comprising at least 45 wt. % silicon oxide and no more than 5 wt. % boron oxide.

In certain embodiments as otherwise described herein, heating the second side comprises heating with a flash lamp.

In certain embodiments as otherwise described herein, heating the second side comprises heating with a pulsed laser.

In certain embodiments as otherwise described herein, removing the phase-separated boron oxide domains comprises selectively etching for a period of time sufficient to remove substantially all of the boron oxide domains.

In certain embodiments as otherwise described herein, selectively etching comprises etching with an acid.

In certain embodiments as otherwise described herein, a diffusing layer is deposited onto the second side of the glass layer before heating the second side, and then the diffusing layer is removed after forming the phase-separated portion.

In certain embodiments as otherwise described herein, the diffusing layer comprises carbon. The carbon (or other light absorbing material) can be applied to the outer surface in order to cause localized surface heating from the flash lamp or pulsed laser.

In certain embodiments as otherwise described herein, the diffusing layer has a thickness in the range of 5 nm to 500 nm.

In certain embodiments as otherwise described herein, a hydrophobic silane layer is deposited onto at least a portion of the second side of the graded layer.

In certain embodiments as otherwise described herein, the deposited silane is covalently linked to the phase-separated silicon oxide domains of the graded layer.

In certain embodiments as otherwise described herein, the graded layer has a thickness within the range of 300 nm to 1 μm.

In certain embodiments as otherwise described herein, the graded layer comprises an inner region adjacent the first side, a middle region adjacent the inner region, and an outer region adjacent the middle region and the second side, and the inner region is substantially non-porous; the middle region comprises a first plurality of pores, wherein the average pore size of the first plurality increases along a gradient from the inner region to the outer region; and the outer region comprises a second plurality of pores.

In certain embodiments as otherwise described herein, the inner region comprises at least 80 wt. % of a non-phase-separated borosilicate glass, and at least about 80 wt. % of the silicon oxide present in the outer region comprises amorphous silica.

In certain embodiments as otherwise described herein, the average pore size of the first plurality of pores increases along the gradient from less than 25 nm, to 50 nm to 180 nm.

In certain embodiments as otherwise described herein, the average pore size of the second plurality of pores is within the range of 50 nm to 180 nm.

In certain embodiments as otherwise described herein, the inner region has a thickness of less than 250 nm; the middle region has a thickness within the range of 250 nm to 750 nm; and the outer region has a thickness of less than 250 nm.

In certain embodiments as otherwise described herein, aerogel is disposed in at least a portion of the pores of the graded layer.

In certain embodiments as otherwise described herein, disposing aerogel comprises forming a sol-gel in at least a portion of the pores of the graded layer; and drying the sol-gel under high pressure and temperature (e.g., at the triple point) to form an aerogel.

In certain embodiments as otherwise described herein, disposing aerogel comprises disposing a suspension of aerogel nanoparticles in at least a portion of the pores of the graded layer; and drying the suspension.

In another aspect, the present disclosure provides an article prepared by a method described herein.

These as well as other aspects, advantages, and alternatives, will become apparent to those of ordinary skill in the

DETAILED DESCRIPTION

Figure 1:
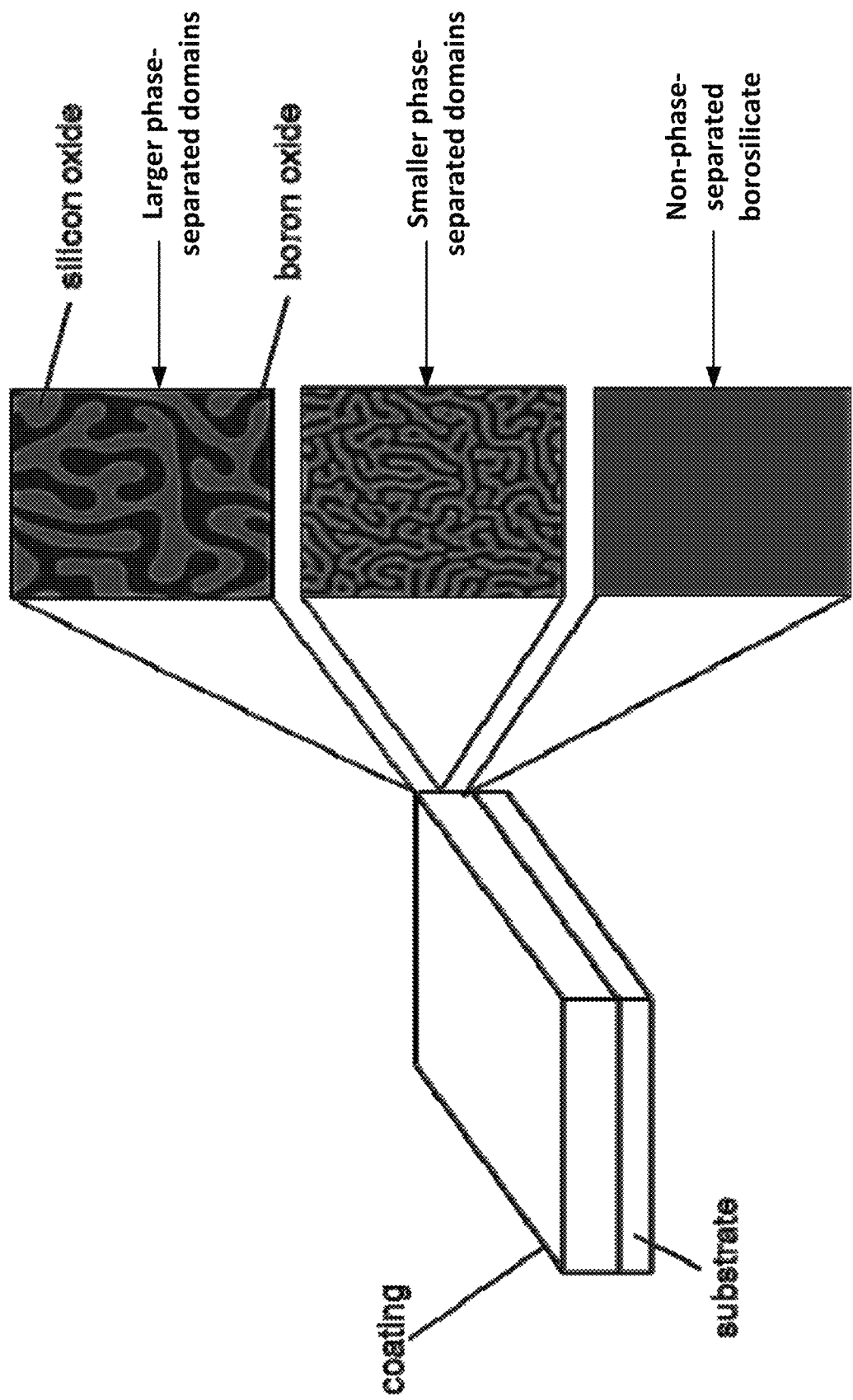
FIG. 1 depicts a glass layer disposed on a substrate, according to one embodiment of the disclosure. The glass layer includes an outer region (top) that has larger phase-separated domains of silicon oxide and boron oxide, a middle region (middle) that has smaller phase-separated domains, and an inner region (bottom) of non-phase-separated borosilicate next to the substrate.

The following detailed description describes various features and functions of the disclosed methods, compositions, and structures. The illustrative embodiments described herein are not meant to be limiting. It will be readily understood that certain aspects of the disclosed methods, compositions, and structures can be arranged and combined in a wide variety of different configurations, all of which are contemplated herein.

A method for preparing an optically transparent, superomniphobic coating on a substrate, such as an optical substrate, is described. "Superhydrophobic," as used herein, describes surfaces or coatings that have a water contact angle of at least about 130°. Also as used herein, "superoleophobic" describes surfaces or coatings that have an oil contact angle of at least about 60°. And as used herein, "superomniphobic" describes surfaces or coatings that have a water contact angle of at least about 130° and an oil contact angle of at least about 60°. Also as used herein, an "optically transparent" coating transmits at least about 90% of incident light (e.g., having a wavelength in the range of 400-1,500 nm).

In one aspect, the present disclosure provides a method for preparing a coating, including providing a glass layer disposed on a substrate, the glass layer having a first side adjacent the substrate and an opposed second side, the glass layer comprising 45-85 wt. % silicon oxide in a first glass phase and 10-40 wt. % boron oxide in a second glass phase, such that the glass layer has a composition in a spinodal decomposition region. The method includes heating the second side of the glass layer to form a phase-separated portion of the layer, the phase-separated portion comprising an interpenetrating network of silicon oxide domains and boron oxide domains, and removing at least a portion of the boron oxide domains from the phase-separated portion to provide a graded layer disposed on the substrate. The graded layer has a first side disposed adjacent the substrate, the first side comprising 45-85 wt. % silicon oxide and 10-40 wt. % boron oxide, and opposite the first side, a porous second side comprising at least 45 wt. % silicon oxide and no more than 5 wt. % boron oxide.

As described above, the method includes providing a glass layer disposed on a substrate, the glass layer comprising 45-85 wt. % silicon oxide in a first glass phase and 10-40 wt. % boron oxide in a second glass phase. As used herein, "oxide" describes oxides in all forms and crystalline phases. For example, "silicon oxide" includes $SiO_2$, $SiO_x$ where x is within the range of 1 to 3, etc. Unless otherwise indicated, regardless of the actual stoichiometry of the oxide, oxides are calculated as the most stable oxide for purposes of weight percent determinations. For example, the person of ordinary skill in the art will appreciate that a non-stoichiometric oxide of silicon, or even another form of silicon, may still be calculated as $SiO_2$.

In certain embodiments as otherwise described herein, the glass layer comprises 45-75 wt. %, or 45-65 wt. %, or 45-55 wt. %, or 55-85 wt. %, or 65-85 wt. %, or 75-85 wt. %, or 50-80 wt. %, or 55-75 wt. %, or 60-70 wt. % silicon oxide. In certain embodiments as otherwise described herein, the glass layer comprises 10-35 wt. %, or 10-30 wt. %, or 10-25 wt. %, or 10-20 wt. %, or 15-40 wt. %, or 20-40 wt. %, or 25-40 wt. %, or 30-40 wt. %, or 15-35 wt. %, or 20-30 wt. % boron oxide.

In certain embodiments as otherwise described herein, the glass layer comprises an alkali-borosilicate glass. For example, in certain embodiments as otherwise described herein, the glass layer comprises an alkali oxide (e.g., sodium oxide). In certain such embodiments, the glass layer comprises 1-20 wt. %, or 1-15 wt. %, or 1-10 wt. %, or 5-20 wt. %, or 10-20 wt. %, or 2.5-17.5 wt. %, or 5-15 wt. % sodium oxide. In certain embodiments as otherwise described herein, the glass layer comprises 55-75 wt. % silicon oxide, 15-25 wt. % boron oxide, and 5-15 wt. % sodium oxide.

In certain embodiments as otherwise described herein, the glass layer has a thickness of up to 1 μm. For example, in certain embodiments, the glass layer has a thickness of 300-900 nm, or 300-800 nm, or 300-700 nm, or 300-600 nm, or 400 nm-1 μm, or 500 nm-1 μm, or 400-900 nm, or 400-800 nm, or 500-700 nm.

In certain embodiments as otherwise described herein, providing the glass layer (e.g., comprising an alkali-borosilicate glass) disposed on a substrate comprises depositing the glass layer onto the substrate by, for example, sputtering, ion-assisted deposition, physical vapor deposition, etc. For example, in certain embodiments, providing the glass layer comprises sputtering a 300-900-nm-thick glass layer comprising 55-75 wt. % silicon oxide, 15-25 wt. % boron oxide, and 5-15 wt. % sodium oxide onto a substrate.

In certain embodiments as otherwise described herein, the substrate is an optical substrate. For example, in certain embodiments, the substrate is optically transparent glass. In certain embodiments as otherwise described herein, the substrate comprises borosilicate glass having a light transmissivity of at least 95% for wavelengths between 700 nm and 1,500 nm.

As described above, the method includes heating the second side of the glass layer (i.e., the side opposed the substrate) to form a phase-separated portion of the layer, the phase-separated portion comprising an interpenetrating network of silicon oxide domains and boron oxide domains. As used herein, "phase-separated domains" describe discrete moieties comprising substantially (e.g., at least 50 wt. %, at least 75 wt. %, or at least 90 wt. %, or at least 95 wt. %) one phase of a precursor material. For example, in certain embodiments, the method includes heating the second side of a glass layer comprising an alkali-borosilicate glass to form, by spinodal decomposition, a phase-separated portion of the layer comprising an interpenetrating network of amorphous silica domains and alkali borate domains (see, e.g., FIG. 1).

Local heating (i.e., of the second side) of the glass layer provides a graded heat distribution throughout the glass layer, such that little or even no heat is provided to the first side of the glass layer (i.e., at the interface of the substrate and the glass layer). Advantageously, such a graded heat distribution can provide sufficient heat to the second side of the layer to effect spinodal decomposition without significantly altering the physical or chemical structure of the first side of the glass layer or the underlying substrate, desirably avoiding damage to the substrate or disruption of substrate-coating adhesion.

Accordingly, in certain embodiments as otherwise described herein, the method includes heating the second side of the glass layer to provide a temperature of the second side of at least 600° C. (e.g., at least 650° C., or at least 700° C.) and a temperature of the first side of at most 500° C. (e.g., at most 400° C., or at least 300° C.). In certain such embodiments, the glass layer comprises 55-75 wt. % silicon oxide, 15-25 wt. % boron oxide, and 5-15 wt. % sodium oxide. In certain such embodiments, the glass layer disposed on the substrate is provided by sputtering the layer onto the substrate. In certain such embodiments, the substrate comprises an optically transparent glass (e.g., an optically transparent borosilicate glass).

In certain embodiments as otherwise described herein, a diffusing layer is deposited onto the second side of the glass layer before heating the second side. Desirably, the diffusing layer can absorb and more evenly distribute heat to the second side of the glass layer, and can further limit the extent of distribution of heat towards the first side of the glass layer. After the phase-separated portion of the layer is formed, the diffusing layer can be removed by any suitable means (e.g., acid). In certain embodiments as otherwise described herein, the diffusing layer comprises carbon. For example, in certain such embodiments, depositing the diffusing layer comprises sputtering a carbon layer onto the second side of the glass layer. In certain embodiments as otherwise described herein, the diffusing layer has a thickness of 5-500 nm, or 5-400 nm, or 5-300 nm, or 5-200 nm, or 50-500 nm, or 100-500 nm, or 200-500 nm, or 50-400 nm, or 50-300 nm.

In certain embodiments as otherwise described herein, heating the second side comprises heating with a flash lamp. In other embodiments, heating the second side comprises heating with a pulsed laser. The person of ordinary skill in the art can determine appropriate parameters for such methods (e.g., pulse or flash energy, duration, repetition rate) to achieve a desired extent of phase separation.

Because spinodal decomposition can be driven by heat (i.e., provided to the second side of the glass layer), the extent of phase-separation (i.e., into silicon oxide domains and boron oxide domains) at any specific position within the layer relates to the amount of heat provided to that position (see, e.g., FIG. 1, where the portion of the layer closer to the substrate comprises smaller phase-separated domains). Accordingly, heating the second side of the glass layer as otherwise described herein forms a phase-separated portion of the layer including the second surface of the layer, the phase-separated portion comprising an interpenetrating network of silicon oxide domains and boron oxide domains. Of course, the size of the separated domains can vary over a cross-section of the layer (e.g., corresponding to the heat distribution resulting from heating the second side of the glass layer).

Accordingly, in certain embodiments as otherwise described herein, the layer after heating comprises a substantially non-separated inner region adjacent the first side of the layer, a partially phase-separated middle region adjacent the inner region, and a substantially phase-separated outer region adjacent the middle region and the second side of the layer. The extent of phase separation within the middle region, and accordingly, the size of the phase-separated domains therein, increases along a gradient from the inner region (e.g., having an effective domain size of about 0) to the outer region (e.g., having an average domain size of 50-180 nm).

As used herein, a "gradient" includes at least a first value at a first position and, at a second position, a second value different from the first. For example, over a size gradient from the inner region to the outer region, the size of phase-separated domains may increase continuously (e.g., linearly, exponentially, etc.) from the first value (e.g., about 0) to the second value (e.g., about 180 nm).

In certain embodiments as otherwise described herein, the inner region of the layer after heating comprises less than 5 wt. % (e.g., less than 2.5 wt. %, or less than 1 wt. %, or less than 0.5 wt. %) of a combined amount of phase-separated boron oxide domains and silicon oxide domains. For example, in certain embodiments as otherwise described herein, the inner region comprises at least 95% wt. % (e.g., at least 97.5 wt. %, or at least 99 wt. %) of an alkali-borosilicate glass, and includes no more than 5 wt. % (e.g. 0-2.5 wt. %, or 0-1 wt. %, or 0-0.5 wt. %) of a combined amount of phase-separated alkali borate domains and amorphous silica domains. In certain embodiments as otherwise described herein, the inner region has a thickness of less than 250 nm, or less than 150 nm, or less than 100 nm, or less than 50 nm, or 10-150 nm, or 10-100 nm, or 10-50 nm.

In certain embodiments as otherwise described herein, the middle region of the layer after heating comprises 20-90 wt. % (e.g., 40-80 wt. %, or 60-80 wt. %) of a combined amount of phase-separated boron oxide domains and silicon oxide domains. For example, in certain embodiments as otherwise described herein, the middle region comprises 10-80 wt. % (e.g., 20-60 wt. %, or 20-40 wt. %) of an alkali-borosilicate glass, and includes 20-90 wt. % (e.g., 40-80 wt. %, or 60-80 wt. %) of a combined amount of phase-separated alkali borate domains and amorphous silica domains. In certain embodiments as otherwise described herein, the average size (e.g., the average minor dimension, or the average diameter) of the phase-separated boron oxide domains of the middle region of the layer increases along a gradient from the inner region to the outer region, from less than 25 nm (e.g., less than 15 nm, or less than 5 nm) to 50-180 nm (e.g., 70-160 nm, or 70-140 nm). In certain embodiments as otherwise described herein, the middle region has a thickness of 250-750 nm, or 250-650 nm, or 250-550 nm, or 250-450 nm, or 350-750 nm, or 450-750 nm, or 550-750 nm, or 300-500 nm, or 350-550 nm, or 400-600 nm, or 450-650 nm, or 500-700 nm.

In certain embodiments as otherwise described herein, the outer region of the layer after heating comprises at least 80 wt. % (e.g., at least 90 wt. %, or at least 95 wt. %, or 90-99 wt. %) of a combined amount of phase-separated boron oxide domains and silicon oxide domains. For example, in certain embodiments as otherwise described herein, the outer region comprises no more than 20 wt. % (e.g., no more than 10 wt. %, or no more than 5 wt. %) of an alkali-borosilicate glass, and includes at least 80 wt. % (e.g., at least 90 wt. %, or at least 95 wt. %, or 90-99 wt. %) of a combined amount of phase-separated alkali borate domains and amorphous silica domains. In certain embodiments as otherwise described herein, the average size (e.g., the average minor dimension, or the average diameter) of the phase-separated boron oxide domains of the outer region of the layer is 50-180 nm, or 50-150 nm, or 50-120 nm, or 50-90 nm, or 80-180 nm, or 110-180 nm, or 140-180 nm, or 70-160 nm, or 70-140 nm, or 70-120 nm. In certain embodiments as otherwise described herein, the outer region has a thickness of less than 250 nm, or less than 150 nm, or less than 100 nm, or less than 50 nm, or 10-150 nm, or 10-100 nm, or 10-50 nm.

After forming a phase-separated portion of the layer (e.g., comprising a middle region and an outer region of the layer), the method includes removing at least a portion of the boron oxide domains from the phase-separated portion to provide a graded layer. In certain embodiments as otherwise described herein, removing at least a portion of the boron oxide domains comprises etching for a period of time sufficient to remove substantially all of the phase-separated boron oxide domains. In certain embodiments as otherwise described herein, removing at least a portion (e.g., substantially all) of the boron oxide domains comprises etching with an acid (e.g., HCl, HF).

Figure 2:
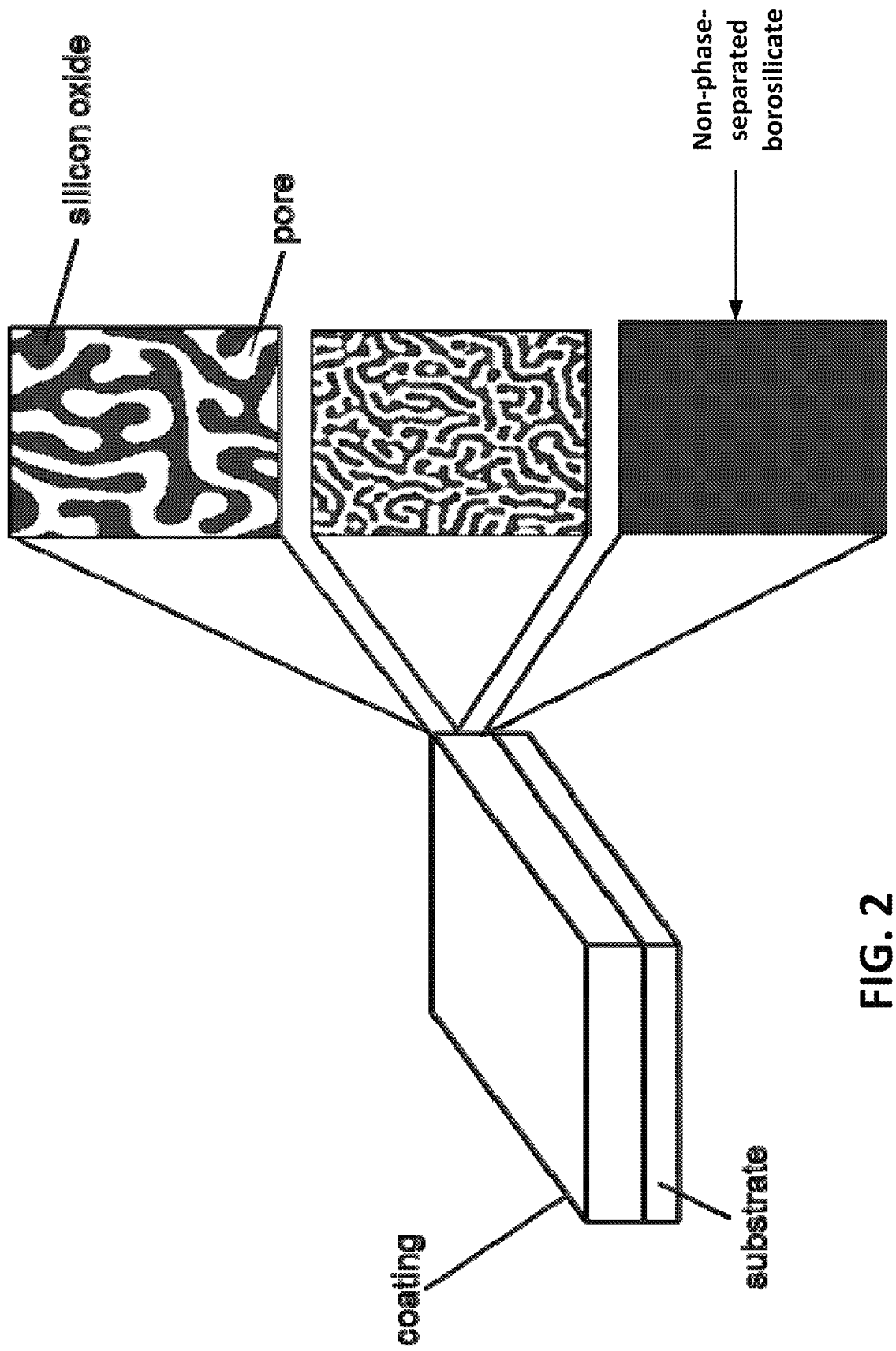
FIG. 2 depicts a graded layer disposed on a substrate, according to one embodiment of the disclosure. The graded layer includes an outer region (top) that has larger pores, a middle region (middle) that has smaller pores, and a non-porous inner region (bottom) of non-phase-separated borosilicate next to the substrate.

Selective removal (e.g., as otherwise described herein) of boron oxide domains from the interpenetrating network of phase-separated boron oxide domains and silicon oxide domains provides a porous material comprising silicon oxide (see, e.g., FIG. 2). As the person of ordinary skill in the art will appreciate, the pore size of the resulting material is related to the size of the removed boron oxide domains (compare, for example, FIG. 1 and FIG. 2). For example, the person of ordinary skill in the art will appreciate that, because acid etchants such as HF can etch boron oxide faster than silicon oxide, etching the phase-separated portion of the layer can remove substantially all of the phase-separated boron oxide domains while removing relatively little of the phase-separated silicon oxide domains, providing a substantially silicon oxide material comprising pores having dimensions similar to, but slightly larger than, those of the removed boron oxide domains.

Accordingly, removing at least a portion of the boron oxide domains from the phase-separated portion of the layer provides a graded layer disposed on the substrate, the graded layer having a first side disposed adjacent the substrate, the first side comprising 45-85 wt. % silicon oxide and 10-40 wt. % boron oxide, and opposed the first side, a porous second side comprising at least 45 wt. % silicon oxide and no more than 5 wt. % boron oxide. In certain embodiments, the first side comprises 45-75 wt. %, or 45-65 wt. %, or 55-85 wt. %, or 65-85 wt. %, or 55-65 wt. %, or 65-75 wt. % silicon oxide, and 10-30 wt. %, or 10-20 wt. %, or 20-40 wt. %, or 30-40 wt. %, or 20-30 wt. % boron oxide. In certain embodiments, the second side comprises at least 55 wt. %, or at least 65 wt. %, or at least 75 wt. %, or at least 85 wt. %, or at least 95 wt. % silicon oxide, and no more than 4 wt. %, or no more than 3 wt. %, or no more than 2 wt. %, or no more than 1 wt. % boron oxide.

In certain embodiments as otherwise described herein, the second side of the graded layer has a porosity of 10-30 vol. %, or 10-20 vol. %, or 20-40 vol. %, or 30-40 vol. %, or 20-30 vol. %. In certain embodiments as otherwise described herein, the average pore size (e.g., the average minor dimension, or the average diameter) of the second side or the graded layer is 50-180 nm, or 50-150 nm, or 50-120 nm, or 50-90 nm, or 80-180 nm, or 110-180 nm, or 140-180 nm, or 70-160 nm, or 70-140 nm, or 70-120 nm.

In certain embodiments as otherwise described herein, the graded layer has a thickness of up to 1 µm. For example, in certain embodiments, the graded layer has a thickness of 300-900 nm, or 300-800 nm, or 300-700 nm, or 300-600 nm, or 400 nm-1 µm, or 500 nm-1 µm, or 400-900 nm, or 400-800 nm, or 500-700 nm.

In certain embodiments as otherwise described herein, the graded layer comprises a substantially non-porous inner region adjacent the first side of the layer, a middle region adjacent the inner region, the middle region comprising a first plurality of pores, and an outer region adjacent the middle region and the second side of the layer, the outer region comprising a second plurality of pores. In certain such embodiments, the average pore size (e.g., the average minor dimension, or the average diameter) of the first plurality increases along a gradient from the inner region (e.g, having an effective pore size of about 0) to the outer region (e.g., having an average pore size of 50-180 nm).

In certain embodiments as otherwise described herein, the inner region of the graded layer comprises at least 80 wt. % (e.g., at least 90 wt. %, at least 95 wt. %, or at least 99 wt. %) of a borosilicate glass (e.g., an alkali-borosilicate glass). In certain embodiments as otherwise described herein, at least 80 wt. % of (e.g., at least 90 wt. %, or at least 95 wt. %, or at least 99 wt. %) of the silicon oxide present in the outer region comprises amorphous silica.

In certain embodiments as otherwise described herein, the inner region of the graded layer comprises less than 5 wt. % (e.g., less than 2.5 wt. %, or less than 1 wt. %, or less than 0.5 wt. %) of phase-separated silicon oxide domains. For example, in certain embodiments as otherwise described herein, the inner region comprises at least 95% wt. % (e.g., at least 97.5 wt. %, or at least 99 wt. %) of an alkali-borosilicate glass, and includes no more than 5 wt. % (e.g. 0-2.5 wt. %, or 0-1 wt. %, or 0-0.5 wt. %) of phase-separated amorphous silica domains. In certain embodiments as otherwise described herein, the inner region has a thickness of less than 250 nm, or less than 150 nm, or less than 100 nm, or less than 50 nm, or 10-150 nm, or 10-100 nm, or 10-50 nm.

In certain embodiments as otherwise described herein, the middle region of the graded layer comprises 20-90 wt. % (e.g., 40-80 wt. %, or 60-80 wt. %) of phase-separated silicon oxide domains. For example, in certain embodiments as otherwise described herein, the middle region comprises 10-80 wt. % (e.g., 20-60 wt. %, or 20-40 wt. %) of an alkali-borosilicate glass, and includes 20-90 wt. % (e.g., 40-80 wt. %, or 60-80 wt. %) of phase-separated amorphous silica domains. In certain embodiments as otherwise described herein, the average pore size (e.g., the average minor dimension, or the average diameter) of the first plurality of pores increases along a gradient from the inner region to the outer region, from less than 25 nm (e.g., less than 15 nm, or less than 5 nm) to 50-180 nm (e.g., 70-160 nm, or 70-140 nm). In certain embodiments as otherwise described herein, the middle region has a thickness of 250-750 nm, or 250-650 nm, or 250-550 nm, or 250-450 nm, or 350-750 nm, or 450-750 nm, or 550-750 nm, or 300-500 nm, or 350-550 nm, or 400-600 nm, or 450-650 nm, or 500-700 nm.

In certain embodiments as otherwise described herein, the outer region of the graded layer comprises at least 80 wt. % (e.g., at least 90 wt. %, or at least 95 wt. %, or 90-99 wt. %) of phase-separated silicon oxide domains. For example, in certain embodiments as otherwise described herein, the outer region comprises no more than 20 wt. % (e.g., no more than 10 wt. %, or no more than 5 wt. %) of an alkali-borosilicate glass, and includes at least 80 wt. % (e.g., at least 90 wt. %, or at least 95 wt. %, or 90-99 wt. %) of phase-separated amorphous silica domains. In certain embodiments as otherwise described herein, the average pore size (e.g., the average minor dimension, or the average diameter) of the second plurality of pores is 50-180 nm, or 50-150 nm, or 50-120 nm, or 50-90 nm, or 80-180 nm, or 110-180 nm, or 140-180 nm, or 70-160 nm, or 70-140 nm, or 70-120 nm. In certain embodiments as otherwise described herein, the outer region has a thickness of less than 250 nm, or less than 150 nm, or less than 100 nm, or less than 50 nm, or 10-150 nm, or 10-100 nm, or 10-50 nm.

In certain embodiments as otherwise described herein, a silane layer is deposited onto at least a portion of the second side of the graded layer. In certain such embodiments, the deposited silane is covalently linked to the phase-separated silicon oxide domains of the graded layer. In certain embodiments as otherwise described herein, depositing the silane layer comprises treating at least a portion of the second side of the graded layer with one or more compounds selected from organosilanes, fluorinated silanes, and disilazanes. For example, in certain embodiments as otherwise described herein, depositing the silane layer comprises disposing a solution comprising one or more compounds selected from organosilanes, fluorinated silanes, and disilazanes in the pores of the graded layer, and then drying the graded layer.

Suitable organosilanes include, but are not limited to alkylchlorosilanes; alkoxysilanes, e.g., methyltrimethoxysilane, methyltriethoxysilane, ethyltrimethoxysilane, ethyltriethoxysilane, n-propyltrimethoxysilane, n-propyltriethoxysilane, i-propyltrimethoxysilane, i-propyltriethoxysilane, butyltrimethoxysilane, butyltriethoxysilane, hexyltrimethoxysilane, octyltrimethoxysilane, 3-mercaptopropyltrimethoxysilane, n-octyltriethoxysilane, phenyltriethoxysilane, and polytriethoxysilane; trialkoxyarylsilanes; isooctyltrimethoxy-silane; N-(3-triethoxysilylpropyl) methoxyethoxyethoxy ethyl carbamate; N-(3-triethoxysilylpropyl)methoxyethoxyethoxyethyl carbamate; polydialkylsiloxanes including, e.g., polydimethylsiloxane; arylsilanes including, e.g., substituted and unsubstituted arylsilanes; alkylsilanes including, e.g., substituted and unsubstituted alkyl silanes including, e.g., methoxy and hydroxy substituted alkyl silanes; and combinations thereof. Suitable alkylchlorosilanes include, for example, methyltrichlorosilane, dimethyldichlorosilane, trimethylchlorosilane, octylmethyldichlorosilane, octyltrichlorosilane, octadecylmethyldichlorosilane and octadecyltrichlorosilane. Other suitable materials include, for example, methylmethoxysilanes such as methyltrimethoxysilane, dimethyldimethoxysilane and trimethylmethoxysilane; methylethoxysilanes such as methyltriethoxysilane, dimethyldiethoxysilane and trimethylethoxysilane; methylacetoxysilanes such as methyltriacetoxysilane, dimethyldiacetoxysilane and trimethylacetoxysilane; vinylsilanes such as vinyltrichlorosilane, vinylmethyldichlorosilane, vinyldimethylchlorosilane, vinyltrimethoxysilane, vinylmethyldimethoxysilane, vinyldimethylmethoxysilane, vinyltriethoxysilane, vinylmethyldiethoxysilane and vinyldimethylethoxysilane.

Suitable fluorinated silanes include fluorinated alkyl-, alkoxy-, aryl- and/or alkylaryl-silanes, and fully perfluorinated alkyl-, alkoxy-, aryl- and/or alkylaryl-silanes. An example of a suitable fluorinated alkoxy-silane is perfluorooctyltrimethoxysilane.

Suitable disilazanes include, for example, hexamethyldisilazane, divinyltetramethyldisilazane and bis(3,3-trifluoropropyl)tetramethyldisilazane. Cyclosilazanes are also suitable, and include, for example, octamethylcyclotetrasilazane.

In certain embodiments as otherwise described herein, aerogel is disposed in at least a portion of the pores of the graded layer. In certain such embodiments, disposing aerogel comprises forming a sol-gel in at least a portion of the pores of the graded layer, and then drying the sol-gel to form an aerogel. For example, in certain embodiments as otherwise described herein, disposing aerogel comprises reacting a silicon alkoxide (e.g., tetramethoxysilane, tetraethoxysilane) and water in the presence of a catalyst (e.g., ammonium hydroxide, ammonium fluoride) in the pores of the graded layer to form a sol-gel, and then drying (e.g., by supercritical solvent extraction) the sol-gel to form an aerogel disposed in the pores of the graded layer.

In other such embodiments, disposing aerogel comprises disposing a suspension of aerogel nanoparticles in at least a portion of the pores of the graded layer, and then drying the suspension. In certain embodiments as otherwise described herein, the aerogel comprises aerogel nanoparticles. In certain desirable embodiments, aerogel nanoparticles are very high surface area (600-800 $m^2/g$) particles with a density between about 100 and 200 $kg/m^3$ and an average particle size of about 200 nm or less. The average aerogel nanoparticle size represents an average linear dimension of the particles (e.g., an average diameter in the case of substantially spherical particles), and it may represent an average grain or crystallite size, or, in the case of agglomerated particles, an average agglomerate size. In some embodiments, the average aerogel nanoparticle size may be less than about 100 nm, less than about 75 nm, or less than about 50 nm. For example, in certain embodiments as otherwise described herein, the aerogel nanoparticles have an average size of 10-90 nm, or 10-80 nm, or 10-70 nm, or 10-60 nm, or 20-90 nm, or 30-90 nm, or 40-90 nm, or 50-90 nm, or 20-40 nm, or 30-50 nm, or 40-60 nm, or 50-70 nm, or 60-80 nm.

In certain embodiments, the aerogel nanoparticles may be obtained by processing precursor powder to reduce the average particle size to about 100 nm or smaller. The aerogel nanoparticles may include nanoscale surface asperities, i.e., a nanoscale surface texture characterized by protruding or sharp features separated by recessed features and/or pores at the particle surface. As the person of ordinary skill in the art would appreciate, the scale of the surface texture is smaller than the average size of the particle; generally, surface asperities are at least about 50% smaller. For example, aerogel particles of about 100 nm in average particle size may include surface asperities of about 25 nm in average size or less, and hydrophobic particles of about 50 nm in average particle size may include surface asperities of about 25 nm in size or less.

Suitable aerogel precursor powders are commercially available from a number of sources, including Cabot Corp. (Boston, Mass.). Suitable aerogel precursor powders are sold under the Nanogel® Aerogel, LUMIRA® Aerogel and ENOVA® Aerogel trade names, and include, for example ENOVA™ Aerogel IC 3110, ENOVA™ Aerogel MT 1100, ENOVA™ Aerogel MT 1200, ENOVA™ Aerogel IC 3120. These porous, nanostructured particles are available in particle sizes ranging from about 5 microns to 4 mm, but may be mechanically milled or sonicated as discussed below to obtain particles of reduced sizes (e.g., 10-90 nm) suitable for the pores of the graded layer as otherwise described herein.

The methods described herein can desirably provide an optically transparent, superomniphobic coating on a substrate, such as an optical substrate. Accordingly, another aspect of the disclosure is an article (e.g., prepared according to a method described herein) comprising a substrate and a graded layer, the graded layer having a first side disposed adjacent the substrate, the first side comprising 45-85 wt. % silicon oxide and 10-40 wt. % boron oxide, and opposed the first side a second side comprising at least 45 wt. % silicon oxide and no more than 5 wt. % boron oxide. The properties of the various components of the article can be as otherwise described above with respect to the methods of the disclosure.

Advantageously, the graded layer as otherwise described herein can comprise a graded index of refraction from, at the second side of the graded layer, an ambient index of refraction to, at the first side, an index of refraction of the substrate. Accordingly, the graded layer can desirably have a light transmissivity of at least 98% (e.g., at least 99% or at least 99.5%) for wavelengths between 400 nm and 1,500 nm.

In certain embodiments, the second side of the graded layer (e.g., prepared according to a method described herein) has a water contact angle of at least 130°, or at least 140°, or at least 150°. In certain such embodiments, the second side of the graded layer has an oil contact angle of at least 60°, or at least 65°, or at least 70°.

The invention claimed is:

1. A method for preparing a coating, comprising
providing a glass layer disposed on a substrate, the glass layer having a first side adjacent the substrate and an opposed second side, the glass layer comprising 45-85 wt. % silicon oxide in a first glass phase and 10-40 wt. % boron oxide in a second glass phase, such that the glass layer has a composition in a spinodal decomposition region;
depositing a diffusing layer onto the second side of the glass layer, wherein the diffusing layer comprises carbon;
heating the second side of the glass layer to form a phase-separated portion of the glass layer, the phase-separated portion comprising an interpenetrating network of silicon oxide domains and boron oxide domains;
removing at least a portion of the boron oxide domains from the phase-separated portion to provide a graded layer disposed on the substrate, the graded layer having
a first side disposed adjacent the substrate, the first side comprising 45-85 wt. % silicon oxide and 10-40 wt. % boron oxide, and
opposite the first side, a porous second side comprising at least 45 wt. % silicon oxide and no more than 5 wt. % boron oxide; and
disposing aerogel in at least a portion of the pores of the graded layer.

2. The method of claim 1, wherein heating the second side comprises heating with a flash lamp.

3. The method of claim 1, wherein heating the second side comprises heating with a pulsed laser.

4. The method of claim 1, wherein removing the phase-separated boron oxide domains comprises selectively etching for a period of time sufficient to remove substantially all of the boron oxide domains.

5. The method of claim 4, comprising etching with an acid.

6. The method of claim 1, wherein the diffusing layer is deposited onto the second side before heating the second side, further comprising:
after forming the phase-separated portion, removing the diffusing layer.

7. The method of claim 1, wherein the diffusing layer has a thickness in the range of 5 nm to 500 nm.

8. The method of claim 1, further comprising depositing a hydrophobic silane layer onto at least a portion of the second side of the graded layer.

9. The method of claim 8, wherein the deposited silane is covalently linked to the phase-separated silicon oxide domains of the graded layer.

10. The method of claim 1, wherein the graded layer has a thickness within the range of 300 nm to 1 µm.

11. The method of claim 1, wherein the graded layer comprises an inner region adjacent the first side, a middle region adjacent the inner region, and an outer region adjacent the middle region and the second side, and wherein
the inner region is substantially non-porous;
the middle region comprises a first plurality of pores, wherein the average pore size of the first plurality increases along a gradient from the inner region to the outer region; and
the outer region comprises a second plurality of pores.

12. The method of claim 11, wherein
the inner region comprises at least 80 wt. % of a non-phase-separated borosilicate glass, and
at least about 80 wt. % of the silicon oxide present in the outer region comprises amorphous silica.

13. The method of claim 11, wherein the average pore size of the first plurality of pores increases along the gradient from less than 25 nm, to 50 nm to 180 nm.

14. The method of claim 11, wherein the average pore size of the second plurality of pores is within the range of 50 nm to 180 nm.

15. The method of claim 11, wherein
the inner region has a thickness of less than 250 nm;
the middle region has a thickness within the range of 250 nm to 750 nm; and
the outer region has a thickness of less than 250 nm.

16. The method of claim 1, wherein disposing aerogel comprises
forming a sol-gel in at least a portion of the pores of the graded layer; and
drying the sol-gel to form an aerogel.

17. The method of claim 1, wherein disposing aerogel comprises
disposing a suspension of aerogel nanoparticles in at least a portion of the pores of the graded layer; and
drying the suspension.

18. The method of claim 1, wherein heating the second side of the glass layer comprises heating the second side of the glass layer with a light source, wherein the diffusing layer absorbs light from the light source to cause localized surface heating.

19. The method of claim 1, wherein the aerogel comprises aerogel nanoparticles having an average particle size of 10 to 90 nm.

* * * * *